United States Patent
Qin

(10) Patent No.: US 11,309,820 B2
(45) Date of Patent: Apr. 19, 2022

(54) SIGNAL EQUALIZATION METHOD, DEVICE AND STORAGE MEDIUM BASED ON MOTOR VIBRATION ACCELERATION

(71) Applicant: AAC Technologies Pte. Ltd., Singapore (SG)

(72) Inventor: Yingming Qin, Shenzhen (CN)

(73) Assignee: AAC Technologies Pte. Ltd., Singapore (SG)

( * ) Notice: Subject to any disclaimer, the term of this patent is extended or adjusted under 35 U.S.C. 154(b) by 0 days.

(21) Appl. No.: 16/992,124

(22) Filed: Aug. 13, 2020

(65) Prior Publication Data

US 2021/0058020 A1 Feb. 25, 2021

(30) Foreign Application Priority Data

Aug. 20, 2019 (CN) .......................... 201910769872.7

(51) Int. Cl.
*H02P 25/032* (2016.01)
*G01P 15/097* (2006.01)
*G01R 31/34* (2020.01)
*H02P 25/06* (2016.01)

(52) U.S. Cl.
CPC .......... *H02P 25/032* (2016.02); *G01P 15/097* (2013.01); *G01R 31/343* (2013.01); *H02P 25/06* (2013.01)

(58) Field of Classification Search
CPC ........ H02P 25/032; H02P 25/06; H02P 23/20; H02P 29/0241
USPC ...................................................... 318/114, 34
See application file for complete search history.

(56) References Cited

U.S. PATENT DOCUMENTS 7,039,542 B2* 5/2006 Fujii .................... G01R 31/343
702/115
10,340,776 B2* 7/2019 Lee .......................... H02P 1/28

\* cited by examiner

*Primary Examiner* — David Luo
(74) *Attorney, Agent, or Firm* — W&G Law Group

(57) ABSTRACT

The disclosure discloses a signal equalization method including: step S10: calculating an motor excitation signal according to an expected target acceleration signal; step S20: obtaining the output voltage according to the motor excitation signal, and setting the maximum output voltage of the signal power amplifier as voltage threshold; step S30: judging whether the output voltage is less than the voltage threshold. The technical proposal of the disclosure obtains a motor excitation signal and an output voltage by calculating an expected target acceleration signal, then compares the output voltage with the maximum output voltage of a signal power amplifier, improving the security of output voltage; according to the voltage peak area reduction method, the output voltage and the maximum operating displacement threshold of the motor are calculated to obtain a more safe output voltage.

6 Claims, 4 Drawing Sheets

US 11,309,820 B2

SIGNAL EQUALIZATION METHOD, DEVICE AND STORAGE MEDIUM BASED ON MOTOR VIBRATION ACCELERATION

FIELD OF THE PRESENT DISCLOSURE

The disclosure relates to a signal equalization technology of vibration acceleration, in particular to a signal equalization method, a device and a storage medium based on motor vibration acceleration.

DESCRIPTION OF RELATED ART

The maximum bearing voltage of the signal power amplifier of the existing linear motor is limited, when the voltage exceeds the bearing limit of the signal power amplifier, the signal power amplifiers cannot work normally, which leads to the vibration efficiency difference of the linear motor.

SUMMARY OF THE DISCLOSURE

The technical proposal of the disclosure obtains a motor excitation signal and an output voltage by calculating an expected target acceleration signal, then compares the output voltage with the maximum output voltage of a signal power amplifier, improving the security of output voltage; according to the voltage peak area reduction method, the output voltage and the maximum operating displacement threshold of the motor are calculated to obtain a more safe output voltage.

The disclosure discloses a signal equalization method including: step S10: calculating an motor excitation signal according to an expected target acceleration signal; step S20: obtaining the output voltage according to the motor excitation signal, and setting the maximum output voltage of the signal power amplifier as voltage threshold; step S30: judging whether the output voltage is less than the voltage threshold. The technical proposal of the disclosure obtains a motor excitation signal and an output voltage by calculating an expected target acceleration signal, then compares the output voltage with the maximum output voltage of a signal power amplifier, improving the security of output voltage; according to the voltage peak area reduction method, the output voltage and the maximum operating displacement threshold of the motor are calculated to obtain a more safe output voltage.

BRIEF DESCRIPTION OF THE DRAWINGS

Many aspects of the exemplary embodiment can be better understood with reference to the following drawings. The components in the drawing are not necessarily drawn to scale, the emphasis instead being placed upon clearly illustrating the principles of the present disclosure.

DETAILED DESCRIPTION OF THE EXEMPLARY EMBODIMENT

The present disclosure will hereinafter be described in detail with reference to an exemplary embodiment. To make the technical problems to be solved, technical solutions and beneficial effects of the present disclosure more apparent, the present disclosure is described in further detail together with the figure and the embodiment. It should be understood the specific embodiment described hereby is only to explain the disclosure, not intended to limit the disclosure.

The terms first, second, third, fourth, and the like (if present) in the specification and claims of the present application and the foregoing drawings are intended to distinguish like objects and are not necessarily intended to describe a particular order or sequence. It should be understood that the data so used can be interchanged at appropriate situation so that the embodiment described herein can be implemented in an order other than what is illustrated or described here. In addition, the terms "include" and "have" and any of their variations are intended to cover non-exclusive inclusion, for example, a process, method, system, product or device that contains a series of steps or units need not be limited to those steps or units that are clearly listed, but may include those that are not clearly listed or for those processes, methods, products Other steps or units inherent in products or equipment.

It should be noted that the descriptions referring to "first," "second," and the like in the present disclosure are for descriptive purposes only and are not to be construed as indicating or implying their relative importance or impliedly indicating the number of indicated technical features. Thus, a feature defined as "first" or "second" may include at least one such feature, either explicitly or implicitly. In addition, the technical scheme between embodiments can be combined with each other, but it must be based on the realization by the person of ordinary skill in the art, when the combination of the technical scheme is contradictory or can not be realized, it should be considered that the combination of the technical scheme does not exist and is not within the scope of protection required by the disclosure.

Figure 1:
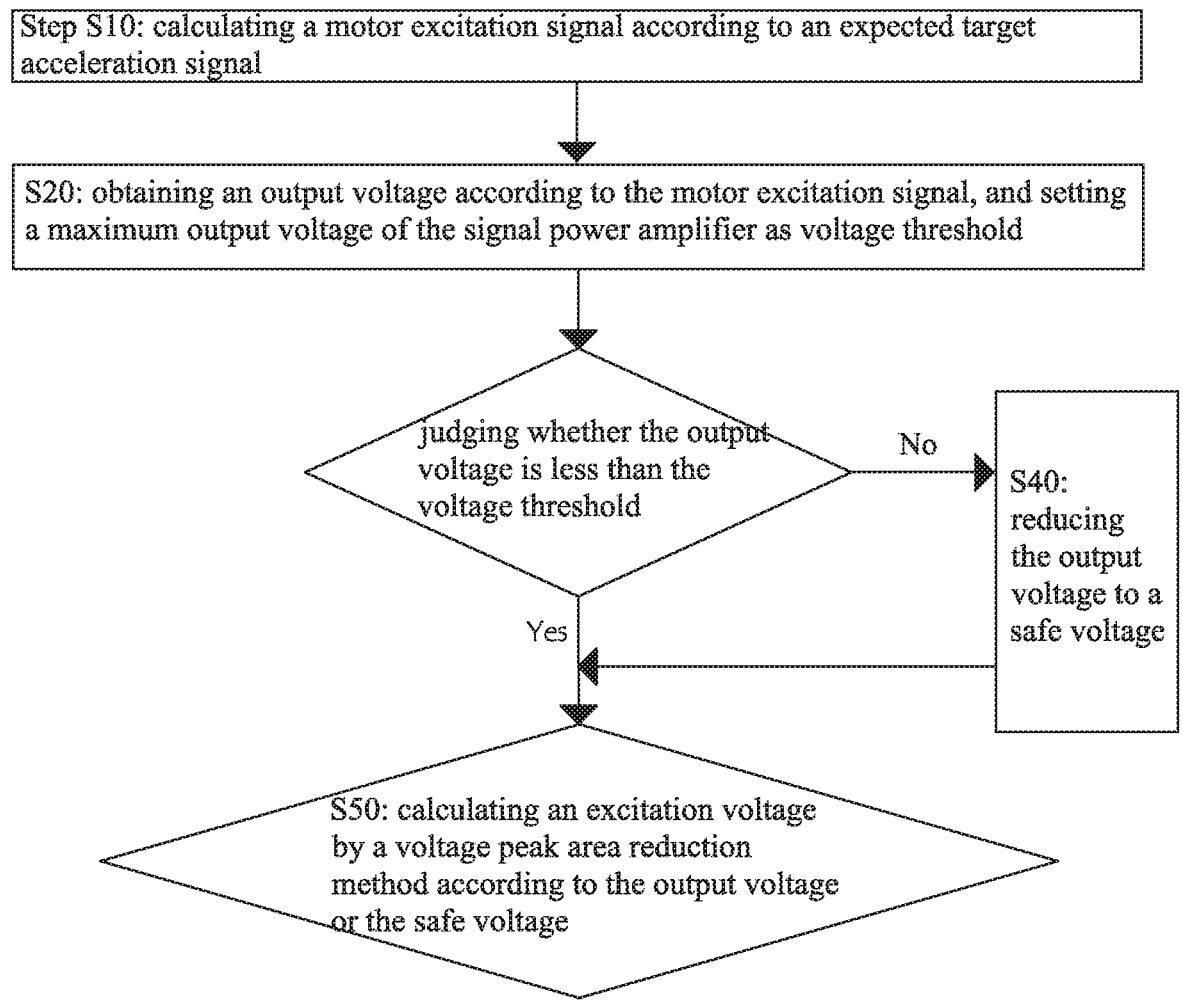
FIG. 1 is a flow chart of a process of a signal equalization method base on motor vibration acceleration provided by an embodiment of the present disclosure.

Please refer to FIG. 1. FIG. 1 is flow chart of a process of a signal equalization method based on motor vibration acceleration provided in the first embodiment. A signal equalization method based on motor vibration acceleration is applied to the field of motors, and the method comprises the following steps:

Step S10: calculating a motor excitation signal according to an expected target acceleration signal;

Alternatively, before the step S10, further comprising: obtaining the basic parameters of the motor;

The basic parameters comprise the maximum vibration displacement of the motor;

Alternatively, the step S10 of calculating the motor excitation signal according to the expected target acceleration signal specifically comprises:

Determine the relationship between the expected target acceleration signal and the excitation signal, as expressed by the following equation (1):

$$\frac{V_{(s)}}{a_{(s)}} = \frac{1 - b_1 a + b_2 a}{1 - a_1 d + a_2 d} \cdot \frac{S^2 + b_1 a \cdot S + b_2 a}{S^2 + a_1 d \cdot S + a_2 d} \tag{1}$$

Wherein, for ease of calculation, $b_1 a$, $b_2 a$, $a_1 d$ and $b_2 d$ are all intermediate parameter values, $b_1 a$, $b_2 a$, $a_1 d$ and $b_2 d$ are expressed by the equations (2), (3), (4), (5) respectively:

$$b_1 a = -2e^{-\omega_0}\cos(\omega_0\sqrt{1-\rho^2}) \tag{2}$$

$$b_2 a = e^{-2\omega_0 \rho} \tag{3}$$

$$a_1d = -2e^{-\omega_d \rho_d} \cos(\omega_d \sqrt{1-\rho^2} d) \quad (4)$$

$$b_2d = \rho^{-2\omega_d \rho_d} \quad (5)$$

Where, for ease of calculation, $\rho$ and $C_t$ are also intermediate parameter values, $\rho$ and $C_t$ are expressed by the equations (6), (7) respectively:

$$\rho = \frac{1}{2} \cdot \frac{C_t}{\sqrt{k_d \cdot m_d}} \quad (6)$$

$$C_t = C_d + \frac{\Phi_0^2}{R_e} \quad (7)$$

Wherein $K_d$ represents the elastic coefficient of the motor, $m_d$ represents the mass of the motor vibrator, $R_e$ represents the motor resistance; $C_d$ represents the mechanical damping of the motor; $\emptyset_0$ represents the total damping of the motor;

Wherein, for ease of calculation, $\rho_d$, $\omega_0$ and $\omega_d$ are also intermediate parameter values, $\rho_d$, $\omega_0$ and $\omega_d$ are expressed by the equations (8), (9), (10) respectively:

$$\rho_d = \frac{1}{2 \cdot Q_d} \quad (8)$$

$$\omega_0 = \frac{k_d}{m_d} \quad (9)$$

$$\omega_d \approx 0.5\omega_0 \quad (10)$$

Wherein, $Q_d$ is valued 2.

Step S20: obtaining the output voltage according to the motor excitation signal, and set the maximum output voltage of the signal power amplifier as voltage threshold;

Step S30: judging whether the output voltage is less than the voltage threshold, and execute step S40 when the output voltage is greater than or equal to the voltage threshold; when the output voltage is less than the voltage threshold, step S50 is executed;

Step S40: reducing the output voltage to safe voltage;

Alternatively, the step S40 specifically comprises:

The part of the output voltage exceeding the voltage threshold is scaled down in equal proportion, so that the output voltage is reduced to within the maximum output voltage range of the signal power amplifier, and the safe voltage is output. In this way, the voltage of the linear motor can be prevented from exceeding the maximum carrying voltage of the signal power amplifier, so that the linear motor can achieve the haptical vibration effect.

Step S50: the excitation voltage is calculated by the voltage peak area reduction method according to the output voltage or safe voltage.

Figure 2:
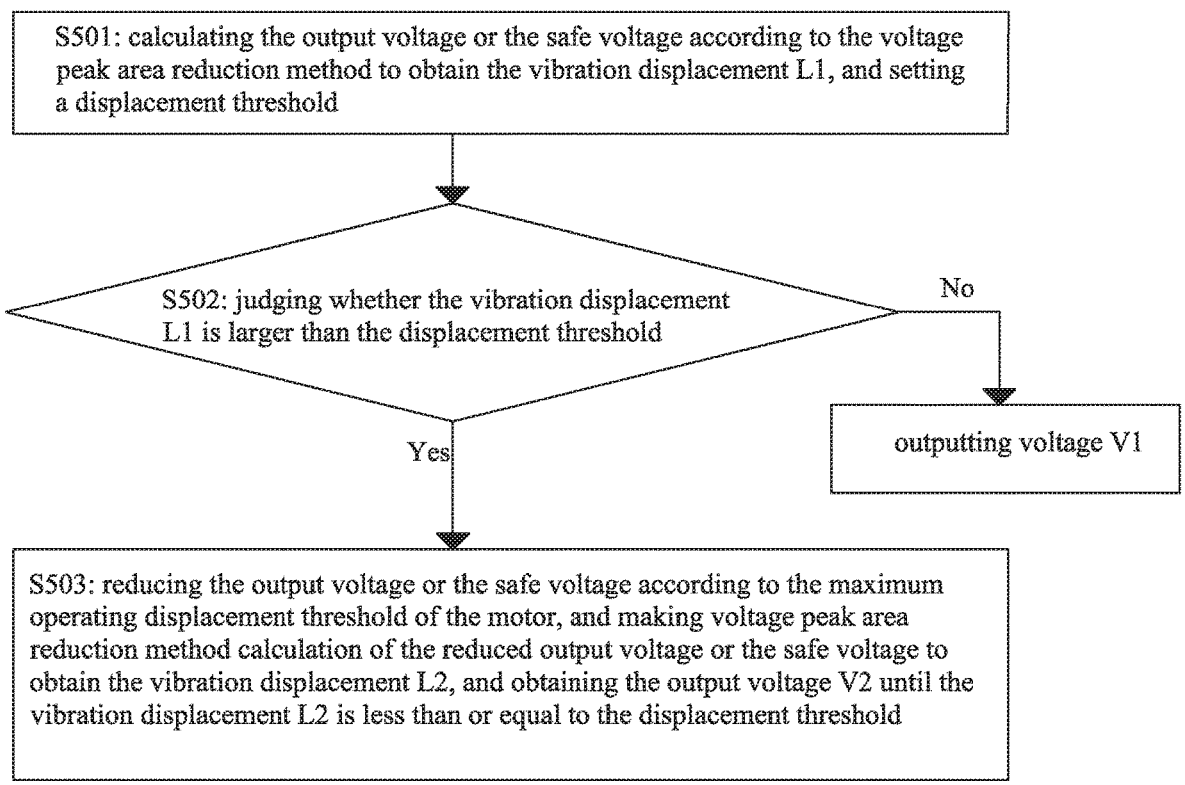
FIG. 2 is a flow chart of a process of a voltage peak area reduction method of step S50 in FIG. 1.

Referring to FIG. 2, alternatively, the excitation voltage calculated by the voltage peak area reduction method in the step S50 comprises:

Step S5011: input the original signal X and the threshold value L;

Where X is the output voltage value of step S30 or step S40, and the threshold value L is the maximum vibration displacement of the motor;

Step S5012: an error array V of the same length as the original signal X is determined, and the initial value of V is set to 0;

Step S5013: traversing the original signal X, and determining the value of V (I) according to the magnitude of X (i) and L;

If the absolute value of X (I) is less than L, V (I)=0;

If $X(I) > L$, $V(I) = X(I) - L$;

If $X(I) \leq -L$, $V(I) = X(I) + L$;

Step S5014: Passing the error signal V (I) through a low-pass FIR filter to obtain V';

Step S5015: Obtaining the signal X' after clipping, X'=X−V'; through the voltage peak area reduction method (Crest Factor Reduction), the safety of the output voltage is further ensured, and the phenomenon of too high voltage is avoided.

Figure 3:
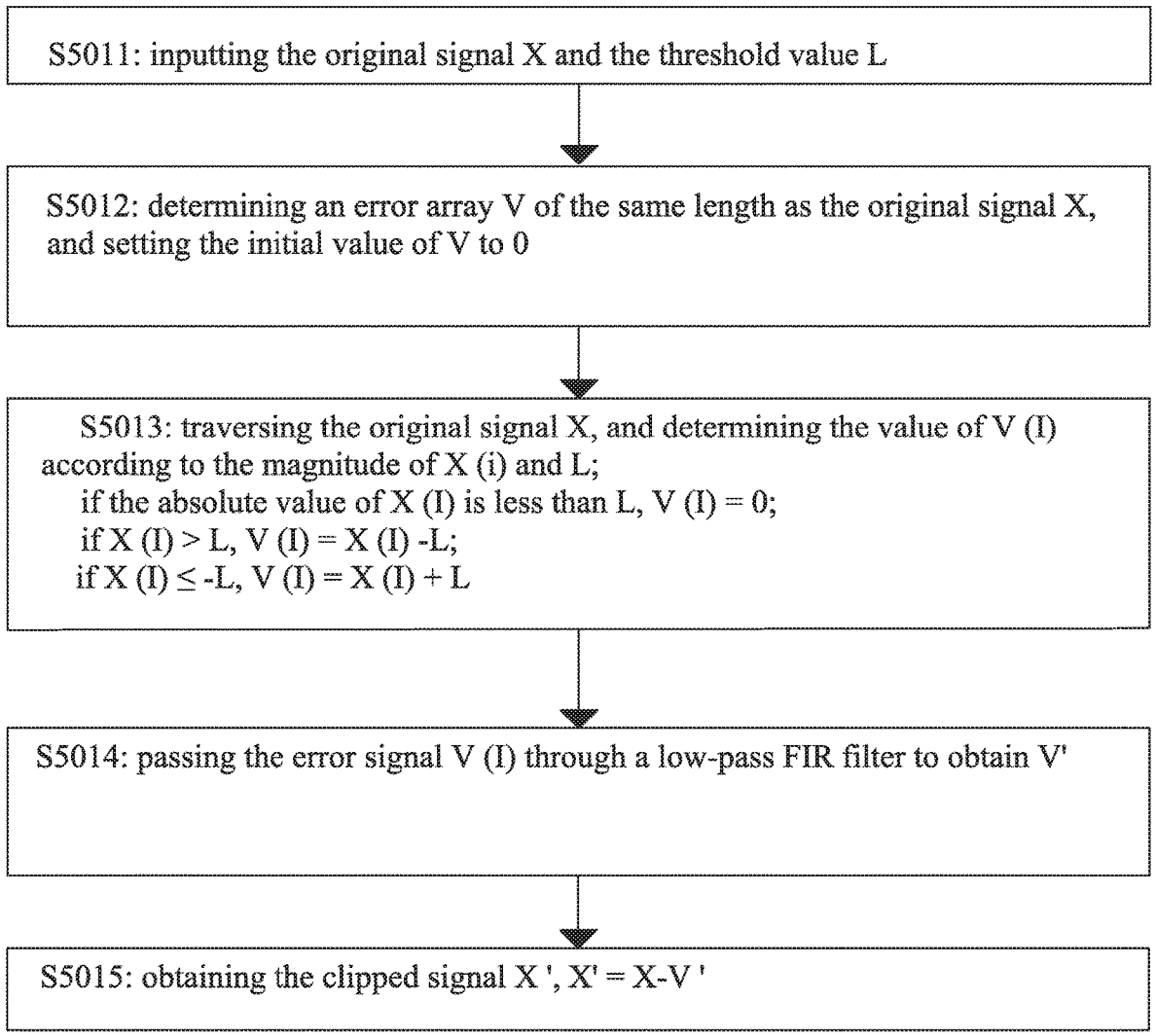
FIG. 3 is a flow chart of step S50 in FIG. 2.

Referring to FIG. 3, the step S50 optionally comprises:

Step S501: calculating the output voltage or the safe voltage according to the voltage peak area reduction method to obtain the vibration displacement L1, and set a displacement threshold;

Step S502: judging whether the vibration displacement L1 is larger than the displacement threshold is judged, and when the vibration displacement L1 is less than or equal to the displacement threshold, output voltage V1 is obtained; enter step S503 when the vibration displacement L1 is greater than the displacement threshold;

Step S503: reducing the output voltage or the safe voltage according to the maximum operating displacement threshold of the motor, and make voltage peak area reduction method calculation of the reduced output voltage or the safe voltage to obtain the vibration displacement L2, and obtain the output voltage V2 when the vibration displacement L2 is less than or equal to the displacement threshold.

It should be pointed out that the displacement threshold of the linear motor is the maximum displacement of the linear motor, and in this embodiment, the safe distance of the motor is chosen to be 90% of the maximum displacement, so that the stability of the operating motor can be guaranteed; specifically, when the safe distance is less than or equal to the displacement threshold, the output voltage is obtained, and the linear motor is excited by a signal power amplification device; when the safe distance is greater than the displacement threshold, the output voltage is reduced according to the maximum operating displacement threshold of the motor, and the reduced output voltage is calculated by the voltage peak area reduction method to obtain the output voltage until the safe distance is less than or equal to the displacement threshold.

A second aspect of the embodiment of the disclosure provides a motor vibration acceleration-based signal equalization device. The device comprises a memory and a processor. A signal equalization program capable of running on the processor is stored into the memory; and the signal equalization program is based on a motor vibration acceleration and achieves steps of a motor vibration acceleration-based signal equalization method when executed by the processor.

Figure 4:
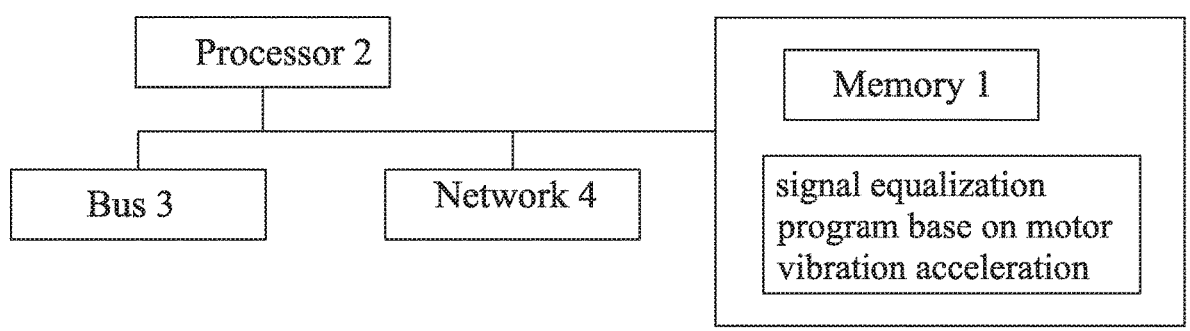
FIG. 4 is an inner structural schematic view of a signal equalization device based on motor vibration acceleration provided by the embodiment of the present disclosure.

Referring to FIG. 4, the present disclosure also provides a signal equalization device based on motor vibration acceleration, and FIG. 4 is an inner structural schematic view of the signal equalization device based on motor vibration acceleration provided by an embodiment of the present disclosure.

In the embodiment, the signal equalization device based on motor vibration acceleration may be a PC (Personal Computer) or a terminal device such as a smart phone, a tablet computer, or a portable computer. The signal equalization device based on motor vibration acceleration comprises at least memory 1, processor 2, communication bus 3, and network interface 4.

Wherein the memory 1 comprises at least one type of readable storage medium including flash memory, hard disk, multimedia card, card-type memory (e.g. SD or DXmemory, etc.), magnetic memory, magnetic disk, optical disk, etc. The memory 1 in some embodiments may be an internal storage unit of the signal equalization device based on motor vibration acceleration signal, such as a hard disk of the signal equalization device based on motor vibration acceleration signal. The memory 1 may also be an external storage device of a signal equalization device based on motor vibration acceleration in other embodiments, such as a plug-in hard disk, a smart memory card (Smart Media Card), a safe digital (Safe Digital, SD) card, Flash Card, etc. which is provided on the signal equalization device based on motor vibrator. Further, the memory 1 may also comprise both an internal storage unit of the signal equalization device based on motor vibration acceleration and an external storage device. The memory 1 may be used not only to store application software installed in a signal equalization device based on motor vibration acceleration and various types of data, such as codes of the signal equalization program based on motor vibration acceleration, but also to temporarily store data that has been or will be output.

The processor 2 in some embodiments may be a central processing unit, (CPU), controller, microcontroller, microprocessor or other data processing chip, for executing the program code or processing data stored in the memory 1, for example, executing the signal equalization program based on motor vibration acceleration.

The communication bus 3 is used to realize the connection communication among these components.

The network interface 4 may optionally comprise a standard wired interface, a wireless interface (such as a Wi-Fi interface), typically used to establish a communication connection between the signal equalization device based on motor vibration acceleration and other electronic devices.

Optionally, the signal equalization device based on motor vibration acceleration may further comprise a user interface, the user interface may comprise a Display, an input unit such as a Keyboard, and optionally such user interfaces also comprises a standard wired interface, a wireless interface. Alternatively, in some embodiments, the display may be an LED display, a liquid crystal display, a touch liquid crystal display, an OLED (Organic Light-Emitting Diode) touchpad, or the like. Wherein, the display may also suitably be referred to as a display screen or display unit for displaying the information processed in the signal equalization device based on motor vibration acceleration and for displaying a visual user interface.

FIG. 4 shows only a signal equalization device based on motor vibration acceleration having components 1-4 and a signal equalization program based on motor vibration acceleration. It would be obvious to a person skilled in the art that, the structure shown in FIG. 4 does not constitute a limitation to a signal equalization device based on motor vibration acceleration, but may comprise fewer or more components than illustrated, or some combination of components, or different component arrangements.

In the embodiment of the signal equalization device based on motor vibration acceleration shown in FIG. 4, the signal equalization program based on motor vibration acceleration is stored in memory 1; when the processor 2 executes the signal equalization program based on motor vibration acceleration stored in the memory 1, it implements the steps of the signal equalization method based on motor vibration acceleration.

A third aspect of the embodiment of the disclosure provides a storage medium. A motor vibration acceleration-based signal equalization program is stored into the storage medium. The motor vibration acceleration-based signal equalization program can be executed by one or more processors to achieve the steps of the motor vibration acceleration-based signal equalization method.

The computer program product comprises one or more computer instructions. When the computer program instructions are loaded and executed on a computer, the flow or function of the embodiment in accordance with the present disclosure is generated in whole or in part. The computer may be a general-purpose computer, a special-purpose computer, a computer network, or other programmable device. The computer instructions may be stored in a computer readable storage medium or transmitted from one computer readable storage medium to another, for example, the computer instructions may be wired from a web site, computer, server, or data center (e.g. coaxial cable, optical fiber, digital subscriber line (DSL)) or wireless (e.g. infrared, wireless, microwave, etc.) to another website, computer, server, or data center. The computer readable storage medium may be any available medium that a computer is capable of storing or a data storage device such as a server, data center or the like that contains an integration of one or more available media. The available media may be magnetic media, (e.g. floppy disk, hard disk, tape), optical media (e.g. DVD), or semi-conductive media (e.g. solid state hard disk Solid State Disk (SSD)), or the like.

It will be apparent to those skilled in the art that, for convenience and conciseness of description, the specific operating processes of the systems, devices and units described above may be referred to the corresponding processes in the aforementioned method embodiment and will not be repeated herein.

In the embodiments provided herein, it is to be understood that the disclosed systems, devices, and methods may be implemented in other ways. For example, the embodiment of the device described above is merely illustrative, for example, the division of the unit is only a logical functional division, and the actual implementation may have other divisions, for example, multiple units or components may be combined or may be integrated into another system, or some features may be omitted or not implemented. As a further point, the coupling or direct coupling or communication connection shown or discussed may be an indirect coupling or communication connection through some interface, device or unit, which may be electrical, mechanical or otherwise.

The cells described as separate components may or may not be physically separated, and the components displayed as cells may or may not be physical cells, i.e. may be located in one place, or may also be distributed over a plurality of network elements. Some or all of the units can be selected according to the actual needs to achieve the purpose of the embodiment scheme.

In addition, each functional unit in each embodiment of the present application may be integrated in one processing unit, each unit may exist physically separately, or two or more than two units may be integrated in one unit. The integrated unit can be realized either in the form of hardware or in the form of software function unit.

The integrated unit, if implemented as a software functional unit and sold or used as a stand-alone product, can be stored in a computer-readable storage medium. Based on such understanding, the technical solution of the present application, intrinsically, or the part contributing to the prior art, or all or part of the technical solution, may be embodied in the form of a software product, which is stored in a storage medium and comprises instructions for making a computer device (this could be a personal computer, a server, or a network device) execute part or all of the steps of the method of each embodiment of the present application. The storage medium comprises a U disk, a removable hard disk, a read-only memory (ROM), a random access memory (RAM), a magnetic disc, an optical disc, and other media capable of storing program codes.

It should be noted that the serial number of the above embodiment of the present disclosure is for description only and does not represent the merits of the embodiment. And the terms "including," "comprising," or any other variation thereof herein are intended to cover non-exclusive inclusions such that a process, device, article, or method comprising a series of elements comprises not only those elements but also other elements not expressly listed, or is otherwise intended to comprise the inclusion of any of the elements intrinsic for such process, device, article or method. Without further limitation, an element limited by the phrase "comprises a" does not preclude the existence of additional identical elements in the process, device, article, or method in which the element is comprised.

The above embodiment is only preferred embodiments of the present disclosure, and are not intended to limit the scope of the patent of the present disclosure. Any equivalent structure or flow transformation made by using the contents of the specification and the attached drawings of this disclosure, or applied directly or indirectly to other related technical fields, are likewise comprised in the scope of patent protection of this disclosure.

It is to be understood, however, that even though numerous characteristics and advantages of the present exemplary embodiment have been set forth in the foregoing description, together with details of the structures and functions of the embodiment, the disclosure is illustrative only, and changes may be made in detail, especially in matters of shape, size, and arrangement of parts within the principles of the disclosure to the full extent indicated by the broad general meaning of the terms where the appended claims are expressed.

What is claimed is:

1. A motor actuation method, comprising steps of:
    Step S10: calculating a motor excitation signal according to an expected target acceleration signal;
    Step S20: obtaining an output voltage according to the motor excitation signal, and setting a maximum output voltage of the signal power amplifier as voltage threshold;
    Step S30: judging whether the output voltage is less than the voltage threshold, and executing step S40 when the output voltage is greater than or equal to the voltage threshold; executing step S50 when the output voltage is less than the voltage threshold;
    Step S40: reducing the output voltage to a safe voltage;
    Step S50: calculating an excitation voltage by a voltage peak area reduction method according to the output voltage or the safe voltage, and exciting the motor to vibrate according to the excitation voltage by a signal power amplification device.

2. The motor actuation method as described in claim 1, wherein step S50 comprises:
    Step S501: calculating the output voltage or the safe voltage according to the voltage peak area reduction method to obtain the vibration displacement L1, and setting a displacement threshold;
    Step S502: judging whether the vibration displacement L1 is larger than the displacement threshold, and when the vibration displacement L1 is less than or equal to the displacement threshold, outputting voltage V1; entering step S503 when the vibration displacement L1 is greater than the displacement threshold;
    Step S503: reducing the output voltage or the safe voltage according to the maximum operating displacement threshold of the motor, and making voltage peak area reduction method calculation of the reduced output voltage or the safe voltage to obtain the vibration displacement L2, and obtaining the output voltage V2 until the vibration displacement L2 is less than or equal to the displacement threshold.

3. The acceleration motor actuation method as described in claim 1, wherein the step S40 specifically comprises:
    sealing down part of the output voltage exceeding the voltage threshold in equal proportion, so that the output voltage is reduced to be within the maximum output voltage range of the signal power amplifier, and outputting the safe voltage.

4. The motor actuation method as described in claim 1, wherein the step S10 further comprises a step of acquiring basic parameters of the motor.

5. The motor actuation method as described in claim 1, wherein the step S50 of calculating the excitation voltage by the voltage peak area reduction method comprises steps of:
    Step S5011: inputting the original signal X and the threshold value L;
    where X is the output voltage value of step S30 or step S40, and the threshold value L is the maximum vibration displacement of the motor;
    Step S5012: determining an error array V of the same length as the original signal X, and setting the initial value of V to 0;
    Step S5013: traversing the original signal X, and determining the value of V (I) according to the magnitude of X (i) and L;
    if the absolute value of X (I) is less than L, V (I)=0;

if $X(I) > L, V(I) = X(I) - L$;

if $X(I) \leq -L, V(I) = X(I) + L$;

Step S5014: passing the error signal V (I) through a low-pass FIR filter to obtain V;
    Step S5015: obtaining the clipped signal X', X'=X−V'.

6. The motor actuation method as described in claim 1, wherein the step S10 of calculating the motor excitation signal according to the expected target acceleration signal is specifically as follows:
    determining the relationship between the expected target acceleration signal and the excitation signal, as expressed by the following equation (1):

$$\frac{V_{(s)}}{a_{(s)}} = \frac{1 - b_1 a + b_2 a}{1 - a_1 d + a_2 d} \cdot \frac{S^2 + b_1 a \cdot S + b_2 a}{S^2 + a_1 d \cdot S + a_2 d} \quad (1)$$

wherein, for ease of calculation, $b_1 a$, $b_2 a$, $a_1 d$ and $b_2 d$ are all intermediate parameter values, $b_1 a$, $b_2 a$, $a_1 d$ and $b_2 d$ are expressed by the equations (2), (3), (4), (5) respectively:

$$b_1 a = -2e^{-\omega_0} \cos(\omega_0 \cdot \sqrt{1 - \rho^2}) \quad (2)$$

$$b_2 a = e^{-2\omega_0 \rho} \quad (3)$$

$$a_1 d = -2e^{-\omega_d \rho d} \cos(\omega_d \sqrt{1-\rho^2} d) \qquad (4)$$

$$b_2 d = \rho^{-2\omega_d \rho d} \qquad (5)$$

Where, for ease of calculation, $\rho$ and $C_t$ are also intermediate parameter values, $\rho$ and $C_t$ are expressed by the equations (6), (7) respectively:

$$\rho = \frac{1}{2} \cdot \frac{C_t}{\sqrt{k_d \cdot m_d}} \qquad (6)$$

$$C_t = C_d + \frac{\Phi_0^2}{R_e} \qquad (7)$$

Wherein $K_d$ represents the elastic coefficient of the motor, $m_d$ represents the mass of the motor vibrator, $R_e$ represents the motor resistance; $C_d$ represents the mechanical damping of the motor; $\Phi_0$ represents the total damping of the motor;

Wherein, for ease of calculation, $\rho_d$, $\omega_0$ and $\omega_d$ are also intermediate parameter values, $\rho_d$, $\omega_0$ and $\omega_d$ are expressed by the equations (8), (9), (10) respectively:

$$\rho_d = \frac{1}{2 \cdot Q_d} \qquad (8)$$

$$\omega_0 = \frac{k_d}{m_d} \qquad (9)$$

$$\omega_d \approx 0.5 \omega_0 \qquad (10)$$

Wherein, $Q_d$ is valued 2.

* * * * *